US010726790B2

(12) United States Patent
Shi (10) Patent No.: US 10,726,790 B2
(45) Date of Patent: Jul. 28, 2020

(54) OLED PIXEL CIRCUIT AND METHOD FOR DRIVING THE SAME, DISPLAY APPARATUS

(71) Applicant: BOE TECHNOLOGY GROUP CO., LTD., Beijing (CN)

(72) Inventor: Ling Shi, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/138,660

(22) Filed: Sep. 21, 2018

(65) Prior Publication Data

US 2019/0164500 A1 May 30, 2019

(30) Foreign Application Priority Data

Nov. 29, 2017 (CN) .......................... 2017 1 1222952

(51) Int. Cl.
*G09G 3/3291* (2016.01)
*G09G 3/3258* (2016.01)
(Continued)

(52) U.S. Cl.
CPC ......... *G09G 3/3291* (2013.01); *G09G 3/3233* (2013.01); *G09G 3/3258* (2013.01); *G09G 2300/043* (2013.01); *G09G 2300/0426* (2013.01); *G09G 2300/0439* (2013.01); *G09G 2300/0819* (2013.01); *G09G 2300/0842* (2013.01); *G09G 2300/0861* (2013.01); *G09G 2310/0262* (2013.01); *G09G 2310/08* (2013.01);
(Continued)

(58) Field of Classification Search
CPC ........................... G09G 3/3291; G09G 3/3258

USPC ............................ 345/55, 76, 205; 370/254
See application file for complete search history.

(56) References Cited

U.S. PATENT DOCUMENTS 10,170,043 B2 * 1/2019 Yin ...................... G09G 3/3233
2011/0025659 A1 * 2/2011 Kwak .................. G09G 3/3233
345/205
(Continued)

FOREIGN PATENT DOCUMENTS

CN  102651198 B    4/2015
CN  105185306    * 12/2015  ........... G09G 3/3233
(Continued)

OTHER PUBLICATIONS

First Office Action issued in corresponding Chinese Patent Applicaiton No. 201711222952.8, dated Mar. 18, 2019; with English translation.
(Continued)

*Primary Examiner* — Prabodh M Dharia
(74) *Attorney, Agent, or Firm* — McDermott Will & Emery LLP (57) ABSTRACT

An OLED pixel circuit includes an initialization and compensation sub-circuit configured to initialize a driving sub-circuit and compensate a threshold voltage of the driving sub-circuit; a data writing sub-circuit configured to input a signal of a second signal end to the driving sub-circuit; a light-emitting control sub-circuit configured to input a signal of the first voltage end to the driving sub-circuit, and input a driving signal output by the driving sub-circuit to a light emitting sub-circuit; the driving sub-circuit configured to output the driving signal; and the light emitting sub-circuit configured to emit light.

10 Claims, 6 Drawing Sheets

(51) Int. Cl.
    *G09G 3/3233* (2016.01)
    *H01L 27/32* (2006.01)

(52) U.S. Cl.
    CPC .............. *G09G 2320/0233* (2013.01); *G09G 2320/045* (2013.01); *H01L 27/3244* (2013.01)

(56) References Cited

U.S. PATENT DOCUMENTS

| | | | |
|---|---|---|---|
| 2014/0111562 A1 | 4/2014 | Wu et al. | |
| 2015/0085699 A1* | 3/2015 | Ho | H04W 16/10 370/254 |
| 2015/0213761 A1* | 7/2015 | Chen | G09G 3/3258 345/77 |
| 2015/0379929 A1* | 12/2015 | Zhai | G09G 3/3233 345/78 |
| 2016/0035276 A1* | 2/2016 | Yin | G09G 3/3233 345/78 |
| 2016/0155383 A1* | 6/2016 | Chen | G09G 3/3233 345/211 |
| 2016/0232849 A1 | 8/2016 | Jeon et al. | |
| 2016/0284273 A1* | 9/2016 | Ma | G09G 3/3258 |
| 2016/0335950 A1 | 11/2016 | Kang et al. | |
| 2017/0148389 A1* | 5/2017 | Zhou | G09G 3/3233 |
| 2017/0243542 A1* | 8/2017 | Xiang | G09G 3/3291 |
| 2017/0249898 A1* | 8/2017 | Ma | G09G 3/3233 |
| 2018/0033365 A1* | 2/2018 | Zhang | G09G 3/3233 |
| 2018/0108298 A1* | 4/2018 | He | G09G 3/3258 |
| 2018/0226020 A1 | 8/2018 | Wang et al. | |
| 2018/0357962 A1* | 12/2018 | Feng | H01L 27/3276 |
| 2019/0005874 A1* | 1/2019 | Zhang | G09G 3/20 |
| 2019/0043426 A1* | 2/2019 | Zhang | G09G 3/3225 |
| 2019/0266942 A1* | 8/2019 | Han | G09G 3/3208 |

FOREIGN PATENT DOCUMENTS

| | | |
|---|---|---|
| CN | 105489168 A | 4/2016 |
| CN | 105869573 A | 8/2016 |
| CN | 106205491 A | 12/2016 |
| CN | 106298844 A | 1/2017 |
| CN | 106910462 A | 6/2017 |
| CN | 106935201 A | 7/2017 |
| CN | 207425323 U | 5/2018 |

OTHER PUBLICATIONS

Second Office Action issued in corresponding Chinese Application No. 201711222952.8, dated Oct. 15, 2019, with English translation.

* cited by examiner

OLED PIXEL CIRCUIT AND METHOD FOR DRIVING THE SAME, DISPLAY APPARATUS

CROSS-REFERENCE TO RELATED APPLICATION

This application claims priority to Chinese Patent Application No. 201711222952.8, field on Nov. 29, 2017, titled "AN OLED PIXEL CIRCUIT AND A METHOD FOR DRIVING THE SAME, A DISPLAY APPARATUS", which is incorporated herein by reference in its entirety.

TECHNICAL FIELD

The present disclosure relates to the field of the display technologies, and more particularly to an OLED pixel circuit and a method for driving an OLED pixel circuit, a display apparatus.

BACKGROUND

An Organic Light Emitting Diode (OLED) display is one of hot topics in the current research field. Compared with a Liquid Crystal Display (LCD), the OLED display has advantages of low power consumption, self-luminescent, wide viewing angle and rapid response etc. A design of a pixel circuit is a key technology content of the OLED display, and has an important research significance.

SUMMARY

Some embodiments of the present disclosure provide an OLED pixel circuit. The OLED pixel circuit includes an initialization and compensation sub-circuit, a data writing sub-circuit, a driving sub-circuit, a light-emitting control sub-circuit and a light emitting sub-circuit. The initialization and compensation sub-circuit is connected to the driving sub-circuit, a first signal end and an initial voltage end, and is configured to initialize the driving sub-circuit and compensate a threshold voltage of the driving sub-circuit according to a signal input by the initial voltage end under control of a signal from the first signal end. The data writing sub-circuit is connected to the driving sub-circuit, the first signal end and a second signal end, and is configured to input a signal of the second signal end to the driving sub-circuit under control of a signal from the first signal end. The light-emitting control sub-circuit is connected to the driving sub-circuit, the light emitting sub-circuit, an enable signal end and a first voltage end, and is configured to input a signal of the first voltage end to the driving sub-circuit, and to input a driving signal output by the driving sub-circuit to the light emitting sub-circuit under control of a signal from the enable signal end. The driving sub-circuit is further connected to a third signal end, and is configured to output the driving signal under control of a signal from the third signal end and under a case of the signal of the first voltage end being input to the driving sub-circuit. The light emitting sub-circuit is further connected to a second voltage end, and is configured to emit light under a driving of the second voltage end and the driving signal input by the light-emitting control sub-circuit.

In some embodiments, the enable signal end and the third signal end are connected with a same signal input end.

In some embodiments, the initialization and compensation sub-circuit is further connected to the light emitting sub-circuit, and is configured to initialize the light emitting sub-circuit according to a signal input by the initial voltage end under control of a signal from the first signal end.

In some embodiments, the driving sub-circuit includes a first transistor, a driving transistor and a reservoir capacitor. A first end of the reservoir capacitor is connected to the data writing sub-circuit, and a second end of the reservoir capacitor is connected to a first electrode of the driving transistor. A gate electrode of the first transistor is connected to the third signal end, a first electrode of the first transistor is connected to the first end of the reservoir capacitor, and a second electrode of the first transistor is connected to a gate electrode of the driving transistor. The gate electrode of the driving transistor is further connected to the initialization and compensation sub-circuit, the first electrode of the driving transistor is further connected to the light-emitting control sub-circuit, and a second electrode of the driving transistor is connected to the initialization and compensation sub-circuit and the light-emitting control sub-circuit.

In some embodiments, the initialization and compensation sub-circuit includes a second transistor and a third transistor. A gate electrode of the second transistor is connected to the first signal end, a first electrode of the second transistor is connected to the initial voltage end, and a second electrode of the second transistor is connected to the driving sub-circuit. A gate electrode of the third transistor is connected to the first signal end, a first electrode of the third transistor is connected to the first electrode of the second transistor, and a second electrode of the third transistor is connected to the driving sub-circuit.

In some embodiments, the initialization and compensation sub-circuit further includes a fourth transistor. A gate electrode of the fourth transistor is connected to the first signal end, a first electrode of the fourth transistor is connected to the initial voltage end, and a second electrode of the fourth transistor is connected to the light emitting sub-circuit.

In some embodiments, the data writing sub-circuit includes a fifth transistor. A gate electrode of the fifth transistor is connected to the first signal end, a first electrode of the fifth transistor is connected to the second signal end, and a second electrode of the fifth transistor is connected to the driving sub-circuit.

In some embodiments, the light-emitting control sub-circuit includes a sixth transistor and a seventh transistor. A gate electrode of the sixth transistor is connected to the enable signal end, a first electrode of the sixth transistor is connected to the first voltage end, and a second electrode of the sixth transistor is connected to the driving sub-circuit. A gate electrode of the seventh transistor is connected to the enable signal end, a first electrode of the seventh transistor is connected to the driving sub-circuit, and a second electrode of the seventh transistor is connected to the light emitting sub-circuit.

In some embodiments, the driving sub-circuit includes a first transistor, a driving transistor and a reservoir capacitor. The initialization and compensation sub-circuit includes a second transistor, a third transistor and a fourth transistor. The data writing sub-circuit includes a fifth transistor. The light-emitting control sub-circuit includes a sixth transistor and a seventh transistor. The light emitting sub-circuit includes a light-emitting device. A gate electrode of the fifth transistor is connected to the first signal end, a first electrode of the fifth transistor is connected to the second signal end, and a second electrode of the fifth transistor is connected to a first end of the reservoir capacitor. A second end of the reservoir capacitor is connected to a first electrode of the driving transistor. A gate electrode of the first transistor is connected to the third signal end, a first electrode of the first transistor is connected to the first end of the reservoir capacitor, and a second electrode of the first transistor is connected to a gate electrode of the driving transistor and a second electrode of the second transistor. The gate electrode of the driving transistor is further connected to the second electrode of the second transistor, the first electrode of the driving transistor is further connected to a second electrode of the sixth transistor, and a second electrode of the driving transistor is connected to a second electrode of the third transistor and a first electrode of the seventh transistor. A gate electrode of the sixth transistor is connected to the enable signal end, and a first electrode of the sixth transistor is connected to the first voltage end. A gate electrode of the seventh transistor is connected to the enable signal end, and a second electrode of the seventh transistor is connected to an anode of the light-emitting device. A gate electrode of the second transistor is connected to the first signal end, and a first electrode of the second transistor is connected to the initial voltage end. A gate electrode of the third transistor is connected to the first signal end, and a first electrode of the third transistor is connected to the initial voltage end. A gate electrode of the fourth transistor is connected to the first signal end, a first electrode of the fourth transistor is connected to the initial voltage end, and a second electrode of the fourth transistor is connected to the anode of the light-emitting device. A cathode of the light emitting device is connected to the second voltage end.

Some embodiments of the present disclosure provide a display apparatus, including the OLED pixel circuit. The OLED pixel circuit includes an initialization and compensation sub-circuit, a data writing sub-circuit, a driving sub-circuit, a light-emitting control sub-circuit and a light emitting sub-circuit. The initialization and compensation sub-circuit is connected to the driving sub-circuit, a first signal end and an initial voltage end, and is configured to initialize the driving sub-circuit and compensate a threshold voltage of the driving sub-circuit according to a signal input by the initial voltage end under control of a signal from the first signal end. The data writing sub-circuit is connected to the driving sub-circuit, the first signal end and a second signal end, and is configured to input a signal of the second signal end to the driving sub-circuit under control of a signal from the first signal end. The light-emitting control sub-circuit is connected to the driving sub-circuit, the light emitting sub-circuit, an enable signal end and a first voltage end, and is configured to input a signal of the first voltage end to the driving sub-circuit, and to input a driving signal output by the driving sub-circuit to the light emitting sub-circuit under control of a signal from the enable signal end. The driving sub-circuit is further connected to a third signal end, and is configured to output the driving signal under control of a signal from the third signal end and in a case of the signal of the first voltage end being input to the driving sub-circuit. The light emitting sub-circuit is further connected to a second voltage end, and is configured to emit light under a driving of the second voltage end and the driving signal input by the light-emitting control sub-circuit.

Some embodiments of the present disclosure provide a method for driving an OLED pixel circuit. The method includes the following contents. In a first phase of a frame, a initialization and compensation sub-circuit inputs a reset signal output via an initial voltage end to a driving sub-circuit, initializes the driving sub-circuit and compensate a threshold voltage of the driving sub-circuit under control of a signal from a first signal end; and a data writing sub-circuit inputs a data signal output via a second signal end to the driving sub-circuit under control of the signal from the first signal end, to store the data signal into the driving sub-circuit. In a second phase of the frame, a light-emitting control sub-circuit inputs a supply voltage output via a first voltage end to the driving sub-circuit under control of a signal from an enable signal end. The driving sub-circuit outputs a driving signal under control of a signal from a third signal end. The light-emitting control sub-circuit inputs the driving signal output by the driving sub-circuit to a light emitting sub-circuit under control of a signal from the enable signal end. The light emitting sub-circuit emits light under a driving of a second voltage end and a driving signal input by the light-emitting control sub-circuit.

In some embodiments, the driving sub-circuit includes a first transistor, a driving transistor and a reservoir capacitor. The initialization and compensation sub-circuit includes a second transistor and a third transistor. The data writing sub-circuit includes a fifth transistor. In the first phase of the frame, the first signal end inputs a turn-on signal, to control the second transistor, the third transistor and the fifth transistor to be turned on. The reset signal output via the initial voltage end is input to the driving transistor via the second transistor, to initialize the driving transistor and compensate a threshold voltage of the driving transistor. The data signal output via the second signal end is input to the reservoir capacitor via the fifth transistor and stored into the reservoir capacitor.

In some embodiments, the initialization and compensation sub-circuit further includes a fourth transistor. In the first phase of the frame, the first signal end inputs a turn-on signal, to control the fourth transistor to be turned on; the reset signal output via the initial voltage end is input to the light emitting sub-circuit via the fourth transistor to initialize the light emitting sub-circuit.

In some embodiments, the light-emitting control sub-circuit includes a sixth transistor and a seventh transistor. In the second phase of the frame, the third signal end inputs a turn-on signal, to control the first transistor to be turned on. The reservoir capacitor transmits the data signal stored in its internal to a gate electrode of the driving transistor via the first transistor, to control the driving transistor to be turned on. The enable signal end inputs a turn-on signal, to control the sixth transistor and the seventh transistor to be turned on. The supply voltage output via the first voltage end is input to the driving transistor via the sixth transistor. The driving transistor outputs the driving signal under control of the data signal and the supply voltage, and the driving signal is transmitted to the light emitting sub-circuit via the seventh transistor. The light emitting sub-circuit emits light under control of the driving signal and the supply voltage output via the second voltage end.

In some embodiments, in the second phase of the frame, the third signal end and the enable signal end inputs turn-on signals simultaneously.

In some embodiments, in a first sub-phase of the second phase of the frame, the third signal end inputs a turn-on signal; and the reservoir capacitor transmits the data signal stored in its internal to the gate electrode of the driving transistor via the first transistor. In a second sub-phase of the second phase of the frame, while the third signal end inputs a turn-on signal continuously, the enable signal end inputs a turn-on signal.

BRIEF DESCRIPTION OF THE DRAWINGS

In order to describe technical solutions in embodiments of the present disclosure or in the related art more clearly, the accompanying drawings to be used in the description of embodiments or the related art will be introduced briefly. Obviously, the accompanying drawings to be described below are merely some embodiments of the present disclosure, and a person of ordinary skill in the art can obtain other drawings according to those drawings without paying any creative effort.

DETAILED DESCRIPTION

Technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Figure 1:
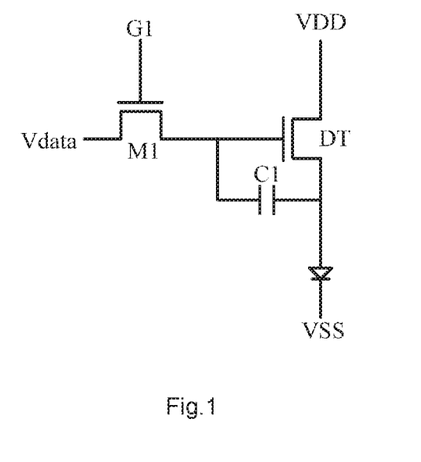
FIG. 1 is a schematic structural diagram of an OLED pixel circuit provided by the related art.

FIG. 1 shows a pixel circuit, and the pixel circuit includes a switch transistor M1, a driving transistor DT, a first capacitor C1 and an OLED device. A gate electrode of the switch transistor M1 is connected with a gate line G1, a first electrode of the switch transistor M1 is connected with a data signal end $V_{data}$, and a second electrode of the switch transistor M1 is connected with a gate electrode of the driving transistor DT. A first electrode of the driving transistor DT is connected with the high-level end VDD, and a second electrode of the driving transistor DT is connected with an anode of the OLED device. A cathode of the OLED device is connected with the low-level end VSS. An end of the first capacitor C1 is connected with the gate electrode of the driving transistor DT, and the other end of the first capacitor C1 is connected with the second electrode of the driving transistor DT.

A driving current Ids, i.e., a current flowing through the driving transistor DT, determines a brightness generated by the OLED device, and which can be expressed as Ids=½k (Vgs−Vth)$^2$, where, k is a conductive parameter of the driving transistor, Vgs is a voltage difference between the gate electrode and a source electrode of the driving transistor DT (for example, the source electrode is one of the above first and second electrodes of the driving transistor DT), the Vth is a threshold voltage of the driving transistor DT.

Due to limitations of manufacture processes and materials of transistors, characteristics of the transistors in various regions of a display panel will be different, thereby resulting in differences of the Vth values of the various driving transistors DT. Therefore, when a same data signal is written into OLED pixel circuits located in different regions of the display panel, the OLED device will be supplied with different currents, thereby resulting in non-uniform display brightness of the display panel.

Figure 2:
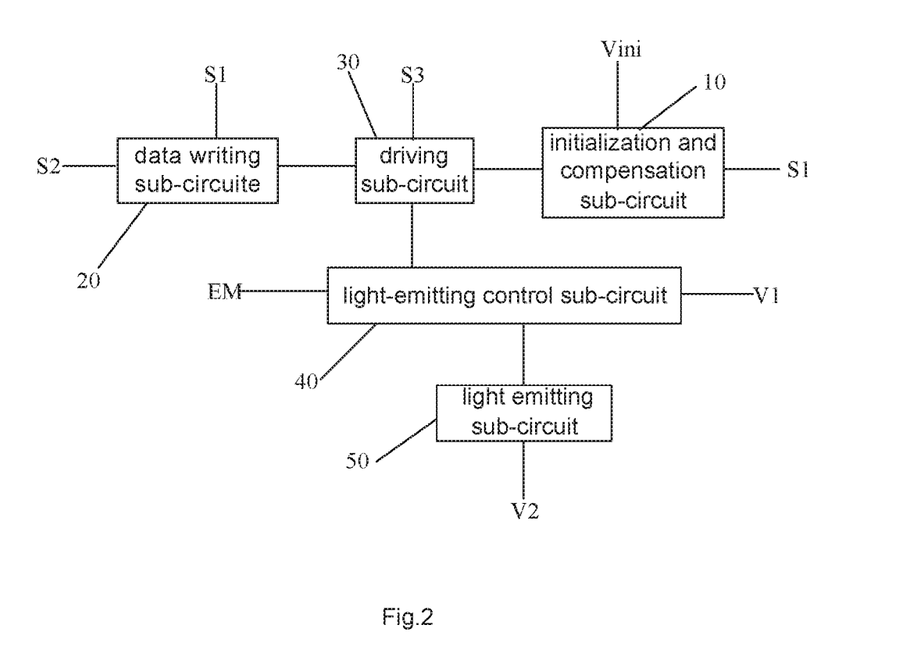
FIG. 2 is a schematic structural diagram of an OLED pixel circuit provided by some embodiments of the present disclosure.

Some embodiments of the present disclosure provide an OLED pixel circuit. As shown in FIG. 2, the OLED pixel circuit includes an initialization and compensation sub-circuit 10, a data writing sub-circuit 20, a driving sub-circuit 30, a light-emitting control sub-circuit 40 and a light emitting sub-circuit 50.

The initialization and compensation sub-circuit 10 is connected to the driving sub-circuit 30, a first signal end S1 and an initial voltage end Vini, and is configured to initialize the driving sub-circuit 30 and compensate a threshold voltage of the driving sub-circuit 30 according to a signal input by the initial voltage end Vini under control of a signal from the first signal end S1.

The data writing sub-circuit 20 is connected to the driving sub-circuit 30, the first signal end S1 and a second signal end S2, and is configured to input a signal (i.e., data signal) of the second signal end S2 to the driving sub-circuit 30 under control of a signal from the first signal end S1.

The light-emitting control sub-circuit 40 is connected to the driving sub-circuit 30, the light emitting sub-circuit 50, an enable signal end EM and a first voltage end V1, and is configured to input a signal of the first voltage end V1 to the driving sub-circuit 30, and input a driving signal output by the driving sub-circuit 30 to the light emitting sub-circuit 50 under control of a signal from the enable signal end EM.

The driving sub-circuit 30 is further connected to a third signal end S3, and is configured to output the driving signal under control of a signal from the third signal end S3 and in a case that the signal of the first voltage end V1 is input to the driving sub-circuit 30.

The light emitting sub-circuit 50 is further connected to a second voltage end V2, and is configured to emit light under a driving of the second voltage end V2 and the driving signal output by the light-emitting control sub-circuit 40.

It should be understood that, the driving signal output by the light-emitting control sub-circuit 40 is the driving signal that is input to the light emitting sub-circuit 50 by the driving sub-circuit 30 under control of the light-emitting control sub-circuit 40.

In the OLED pixel circuit provided by the embodiments of the present disclosure, the threshold voltage generated by the driving sub-circuit 30 is compensated by providing the initialization and compensation sub-circuit 10 in the OLED pixel circuit. In this case, if the same data signal is written into the OLED pixel circuits in different regions of the display panel, the different OLED pixel circuits may not have a difference in the threshold voltage, and thus the current supplied to the OLED devices in different regions may not be different. Therefore the problem that the display panel displays uneven brightness may be avoided.

In some embodiments, the enable signal end EM and the third signal end S3 are connected with a same signal input end.

By means of connecting both of the enable signal end EM and the third signal end S3 to the same signal input end, a structure of the pixel circuit may be simplified and the cost of driving an integrated circuit (IC) may be reduced on the basis of ensuring the pixel compensation capability.

Figure 3:
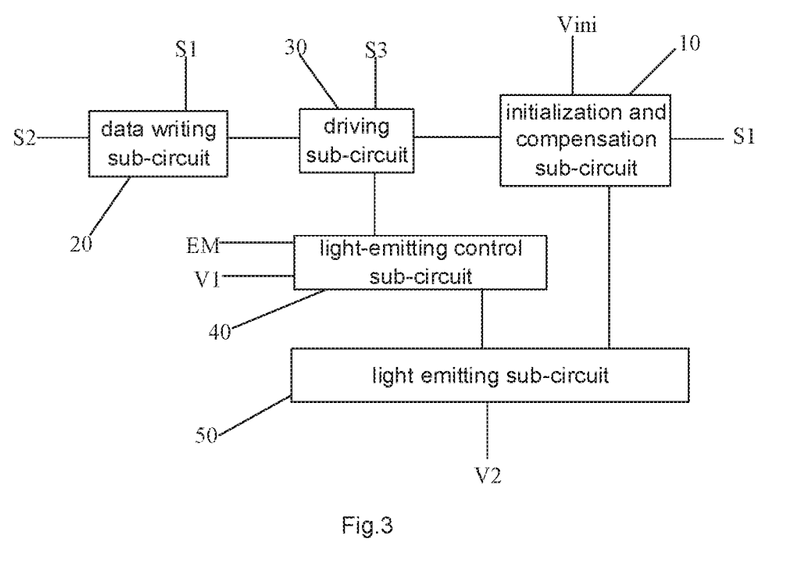
FIG. 3 is a schematic structural diagram of another OLED pixel circuit provided by some embodiments of the present disclosure.

In some embodiments, as shown in FIG. 3, the initialization and compensation sub-circuit 10, which is further connected to the light emitting sub-circuit 50, is configured to initialize the light emitting sub-circuit 50 according to a signal input by the initial voltage end Vini under control of the signal from the first signal end S1.

Through initializing the light emitting sub-circuit 50, the uniformity of the display effect may be further improved.

Figure 4:
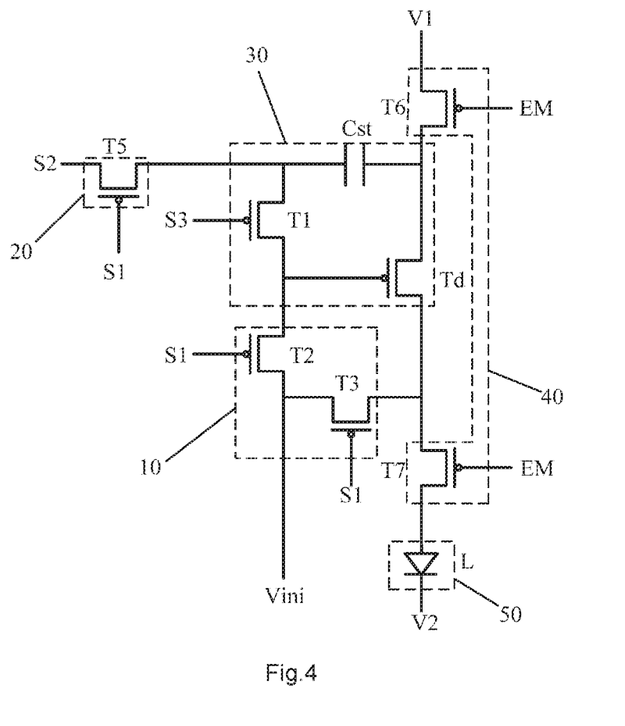
FIG. 4 is a schematic structural diagram of each of sub-circuits of the OLED pixel circuit shown in FIG. 2.
Figure 5:
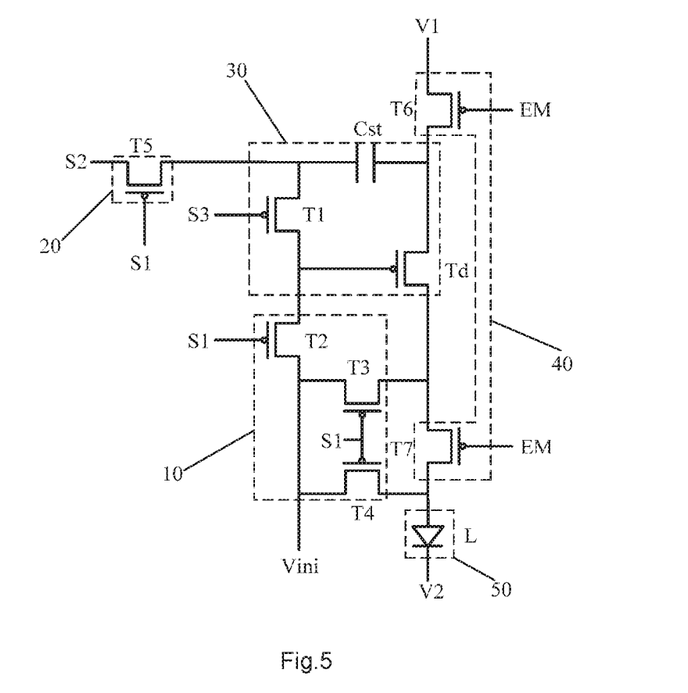
FIG. 5 is a various diagram of each of sub-circuits of the OLED pixel circuit shown in FIG. 3.

In some embodiments, as shown in FIGS. 4 and 5, the driving sub-circuit 30 includes a first transistor T1, a driving transistor Td and a reservoir capacitor Cst.

The reservoir capacitor Cst includes a first end and a second end. The first end is connected to the data writing sub-circuit 20, and the second end is connected to a first electrode of the driving transistor Td.

The first transistor T1 includes a gate electrode, a first electrode and a second electrode. The gate electrode of the first transistor T1 is connected to the third signal end S3, the first electrode of the first transistor T1 is connected to the first end of the reservoir capacitor Cst, and the second electrode of the first transistor T1 is connected to a gate electrode of the driving transistor Td.

The driving transistor Td includes the gate electrode, the first electrode and a second electrode. The gate electrode of the driving transistor Td is further connected to the initialization and compensation sub-circuit 10, the first electrode is further connected to the light-emitting control sub-circuit 40, and the second electrode is connected to the initialization and compensation sub-circuit 10 and the light-emitting control sub-circuit 40.

In some embodiments, the driving sub-circuit 30 further includes a plurality of driving transistors in parallel with the driving transistor Td. In some other embodiments, the driving sub-circuit 30 further includes a plurality of switch transistors in parallel with the first transistor T1. In some other embodiments, the driving sub-circuit 30 further includes the plurality of driving transistors in parallel with the driving transistor Td and the plurality of switch transistors in parallel with the first transistor T1. The above are merely some exemplars of the driving sub-circuit 30, other structures having the same functions with the driving sub-circuit 30 will not be repeated herein, but all should belong to the protection scope of the present disclosure.

In some embodiments, as shown in FIG. 4, the initialization and compensation sub-circuit 10 includes a second transistor T2 and a third transistor T3.

The second transistor T2 includes a gate electrode, a first electrode and a second electrode. The gate electrode of the second transistor T2 is connected to the first signal end S1, the first electrode of the second transistor T2 is connected to the initial voltage end Vini, and the second electrode of the second transistor T2 is connected to the driving sub-circuit 30.

In the case that the driving sub-circuit 30 includes the first transistor T1, the driving transistor Td and the reservoir capacitor Cst, the second electrode of the second transistor T2 is connected to the gate electrode of the driving transistor Td.

The third transistor T3 includes a gate electrode, a first electrode and a second electrode. The gate electrode of the third transistor T3 is connected to the first signal end S1, the first electrode of the third transistor T3 is connected to the first electrode of the second transistor T2, and the second electrode of the third transistor T3 is connected to the driving sub-circuit 30.

In the case that the driving sub-circuit 30 includes the first transistor T1, the driving transistor Td and the reservoir capacitor Cst, the second electrode of the third transistor T3 is connected to the second electrode of the driving transistor Td.

In some embodiments, the initialization and compensation sub-circuit 10 further includes a plurality of switch transistors in parallel with the second transistor T2. In some other embodiments, the initialization and compensation sub-circuit 10 further includes a plurality of switch transistors in parallel with the third transistor T3. In some other embodiments, the initialization and compensation sub-circuit 10 further includes the plurality of switch transistors in parallel with the second transistor T2 and the plurality of switch transistors in parallel with the third transistor T3. The above are merely some exemplars of the initialization and compensation sub-circuit 10, other structures having the same functions with the initialization and compensation sub-circuit 10 will not be repeated herein, but all should belong to the protection scope of the present disclosure.

In some embodiments, as shown in FIG. 5, the initialization and compensation sub-circuit 10 includes the second transistor T2, the third transistor T3 and a fourth transistor T4.

The second transistor T2 includes a gate electrode, a first electrode and a second electrode. The gate electrode of the second transistor T2 is connected to the first signal end S1, the first electrode of the second transistor T2 is connected to the initial voltage end Vini, and the second electrode of the second transistor T2 is connected to the driving sub-circuit 30.

Under the case that the driving sub-circuit 30 includes the first transistor T1, the driving transistor Td and the reservoir capacitor Cst, the second electrode of the second transistor T2 is connected to the gate electrode of the driving transistor Td.

The third transistor T3 includes a gate electrode, a first electrode and a second electrode. The gate electrode of the third transistor T3 is connected to the first signal end S1, the first electrode of the third transistor T3 is connected to the first electrode of the second transistor T2, and the second electrode of the third transistor T3 is connected to the driving sub-circuit 30.

In the case that the driving sub-circuit 30 includes the first transistor T1, the driving transistor Td and the reservoir capacitor Cst, the second electrode of the third transistor T3 is connected to the second electrode of the driving transistor Td.

The fourth transistor T4 includes a gate electrode, a first electrode and a second electrode. The gate electrode of the fourth transistor T4 is connected to the first signal end S1, the first electrode of the fourth transistor T4 is connected to the initial voltage end Vini, and the second electrode of the fourth transistor T4 is connected to the light emitting sub-circuit 50.

In the case that the light emitting sub-circuit 50 includes a light-emitting device L, the second electrode of the fourth transistor T4 is connected to an anode of the light-emitting device L.

In some embodiments, the initialization and compensation sub-circuit 10 further includes a plurality of switch transistors in parallel with the second transistor T2. In some other embodiments, the initialization and compensation sub-circuit 10 further includes a plurality of switch transistors in parallel with the third transistor T3. In some other embodiments, the initialization and compensation sub-circuit 10 further includes a plurality of switch transistors in parallel with the fourth transistor T4. In some other embodiments, the initialization and compensation sub-circuit 10 further includes the plurality of switch transistors in parallel with the second transistor T2 and the plurality of switch transistors in parallel with the third transistor T3. In some other embodiments, the initialization and compensation sub-circuit 10 further includes the plurality of switch transistors in parallel with the second transistor T2 and the plurality of switch transistors in parallel with the fourth transistor T4. In some other embodiments, the initialization and compensation sub-circuit 10 further includes the plurality of switch transistors in parallel with the third transistor T3 and the plurality of switch transistors in parallel with the fourth transistor T4. In some other embodiments, the initialization and compensation sub-circuit 10 further includes the plurality of switch transistors in parallel with the second transistor T2, the plurality of switch transistors in parallel with the third transistor T3 and the plurality of switch transistors in parallel with the fourth transistor T4. The above are merely exemplars of the initialization and compensation sub-circuit 10, other structures having the same functions with the initialization and compensation sub-circuit 10 will not be repeated herein, but all should belong to the protection scope of the present disclosure.

In some embodiments, as shown in FIGS. 4 and 5, the data writing sub-circuit 20 includes a fifth transistor T5.

The fifth transistor T5 includes a gate electrode, a first electrode and a second electrode. The gate electrode of the fifth transistor T5 is connected to the first signal end S1, the first electrode of the fifth transistor T5 is connected to the second signal end S2 (i.e., data signal end), and the second electrode of the fifth transistor T5 is connected to the driving sub-circuit 30.

In the case that the driving sub-circuit 30 includes the first transistor T1, the driving transistor Td and the reservoir capacitor Cst, the second electrode of the fifth transistor T5 is connected to the first end of the reservoir capacitor Cst.

In some embodiments, the data writing sub-circuit 20 further includes a plurality of switch transistors in parallel with the fifth transistor 15. The above are merely an exemplar of the data writing sub-circuit 20, other structures having the same functions with the data writing sub-circuit 20 will not be repeated herein, but all should belong to the protection scope of the present disclosure.

In some embodiments, as shown in FIGS. 4 and 5, the light-emitting control sub-circuit 40 includes a sixth transistor T6 and a seventh transistor T7.

The sixth transistor T6 includes a gate electrode, a first electrode and a second electrode. The gate electrode of the sixth transistor T6 is connected to the enable signal end EM, the first electrode of the sixth transistor T6 is connected to the first voltage end V1, and the second electrode of the sixth transistor T6 is connected to the driving sub-circuit 30.

In the case that the driving sub-circuit 30 includes the first transistor T1, the driving transistor Td and the reservoir capacitor Cst, the second electrode of the sixth transistor T6 is connected to the first electrode of the driving transistor Td.

The seventh transistor T7 includes a gate electrode, a first electrode and a second electrode. The gate electrode of the seventh transistor T7 is connected to the enable signal end EM, the first electrode of the seventh transistor T7 is connected to the driving sub-circuit 30, and the second electrode of the seventh transistor T7 is connected to the light emitting sub-circuit 50.

In the case that the driving sub-circuit 30 includes the first transistor T1, the driving transistor Td and the reservoir capacitor Cst, the first electrode of the seventh transistor T7 is connected to the second electrode of the driving transistor Td. In the case that the light emitting sub-circuit 50 includes the light-emitting device L, the second electrode of the seventh transistor T7 is connected to the anode of the light-emitting device L.

In some embodiments, the light-emitting control sub-circuit 40 further includes a plurality of switch transistors in parallel with the sixth transistor T6. In some other embodiments, the light-emitting control sub-circuit 40 further includes a plurality of switch transistors in parallel with the seventh transistor T7. In some other embodiments, the light-emitting control sub-circuit 40 further includes the plurality of switch transistors in parallel with the sixth transistor T6 and the plurality of switch transistors in parallel with the seventh transistor T7. The above are merely some exemplars of the light-emitting control sub-circuit 40, other structures having the same functions with the light-emitting control sub-circuit 40 will not be repeated herein, but all should belong to the protection scope of the present disclosure.

As shown in FIGS. 4 and 5, the light emitting sub-circuit 50 includes the light-emitting device L. In some embodiments, as shown in FIG. 4, the anode of the light-emitting device L is connected to the light-emitting control sub-circuit 40. In some embodiments, as shown in FIG. 5, the anode of the light-emitting device L is connected to the initialization and compensation sub-circuit 10 and the light-emitting control sub-circuit 40. As shown in FIGS. 4 and 5, a cathode of the light-emitting device L is connected to the second voltage end V2.

It will be noted that, a type of the transistor in each of the sub-circuits is not limited. In some embodiments, the driving transistor Td, the first transistor T1, the second transistor T2, the third transistor T3, the fourth transistor T4, the fifth transistor T5, the sixth transistor T6 and the seventh transistor T7 are N-type transistors. In some other embodiments, the driving transistor Td, the first transistor T1, the second transistor T2, the third transistor T3, the fourth transistor T4, the fifth transistor T5, the sixth transistor T6 and the seventh transistor T7 are P-type transistors. The following embodiments of the present disclosure are all illustrated by taking the transistors being the P-type transistors for example.

A first electrode of each of the transistors is a drain electrode, and a second electrode thereof is a source electrode. Alternatively, the first electrode of each of the transistors is a source electrode, and the second electrode thereof is a drain electrode.

The transistors in the pixel circuit can be divided into enhancement type transistors and depletion type transistors according to the difference of conductive methods of the transistors. The type is not limited in the embodiments of the present disclosure.

Some embodiments of the present disclosure are all illustrated by taking the first voltage end V1 inputting a high level, and the second voltage end V2 inputting a low level or the second voltage end V2 being grounded as an example. Terms "high" and "low" here only indicate the relative magnitude relationship between the input voltages.

Figure 6:
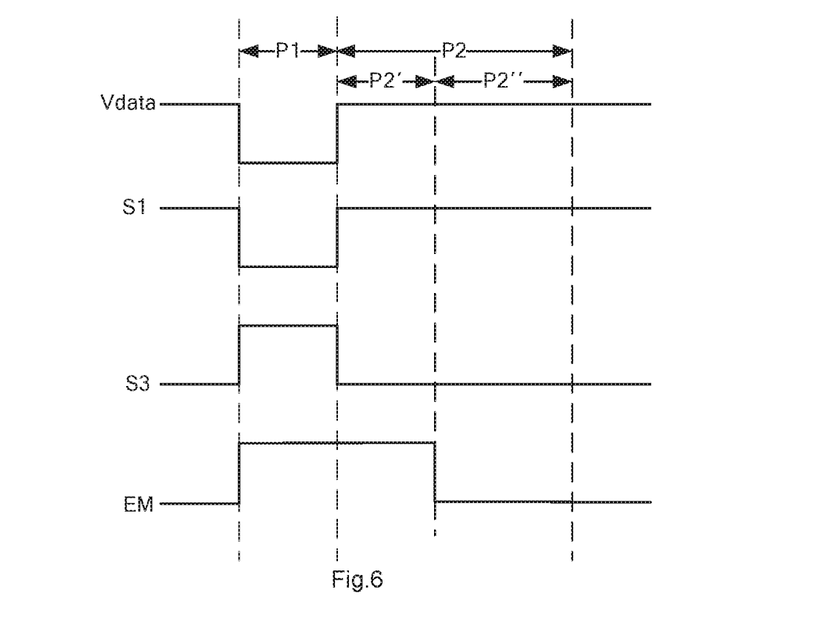
FIG. 6 is a signal timing diagram used to drive the OLED pixel circuits shown in FIGS. 4 and 5.

Based on the above description of each of the sub-circuits by their exemplary realizations, an exemplary driving process of the OLED pixel circuit shown in FIG. 5 is described in detail below with reference to the timing of FIG. 6. As shown in FIG. 6, by using this OLED pixel circuit, the display process (i.e., the driving process of the OLED pixel circuit) of each frame of image is divided into a first phase P1 and a second phase P2.

In the first phase P1 of a frame, a low level turn-on signal is output via the first signal end S1, and high level turn-off signals are output via both of the third signal end S3 and the enable signal end EM. An equivalent circuit diagram of the OLED pixel circuit shown in FIG. 5 is shown as FIG. 7, the second transistor T2, the third transistor T3, the fourth transistor T4 and the fifth transistor T5 are all turned on, while the first transistor T1, the sixth transistor T6 and the seventh transistor T7 are all turned off. In all the equivalent circuit diagrams, the transistors in the turn-off state are expressed by a symbol "×".

Figure 7:
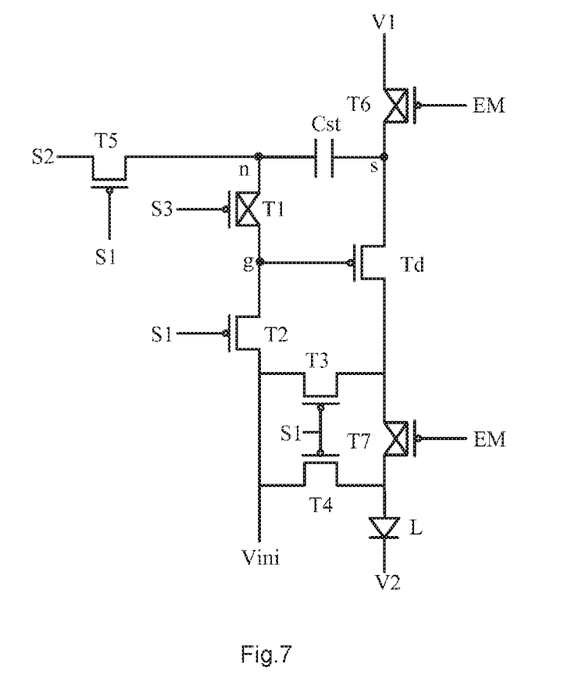
FIGS. 7-9 are equivalent circuit diagrams of the OLED pixel circuit shown in FIG. 5 corresponding to different situations.

The second transistor T2 is turned on, so that a signal output by the initial voltage end Vini is input to the gate electrode (i.e., a point "g") of the driving transistor Td via the second transistor T2, to initialize the gate of the driving transistor Td. If the signal output by the initial voltage end Vini is a reset voltage and the signal is denoted as Vr, a voltage of the gate electrode (the point "g") of the driving transistor Td is Vr. Since a voltage of the first electrode (a point "s") of the driving transistor Td is a supply voltage (denoted as VDD) output via the first voltage end V1, and Vr−VDD<Vth (Vth is the threshold voltage), the driving transistor Td is turned on.

The fourth transistor T4 is turned on, so that the signal output via the initial voltage end Vini is input to the anode of the light-emitting device L via the fourth transistor T4, to initialize the anode of the light-emitting device L. In order to avoid the light-emitting device L emitting light, Vr needs to satisfy that Vr<VSS+Vth_oled, wherein Vth_oled is a threshold voltage of the light-emitting device, and VSS is the supply voltage output via the second voltage end V2.

Meanwhile, the third transistor T3 is turned on, so that the voltage of the first electrode (the point "s") of the driving transistor Td is released until the voltage of the first electrode (the point "s") is Vr−Vth, and then the driving transistor Td is turned off.

In addition, the fifth transistor T5 is turned on, so that a data signal output via the second signal end S2 store into the reservoir capacitor Cst by means of the fifth transistor T5. If the data signal output via the second signal end V2 is Vdata, a voltage of the first end (a point "n") of the reservoir capacitor Cst is Vdata.

After the first phase P1 is over, a voltage at the point "g" is Vr, a voltage at the point "s" is Vr−Vth, and a voltage at the point "n" is Vdata.

In the second phase P2 of the frame, for example in a first sub-phase P2', a low level turn-on signal is output via the third signal end S3, and high level turn-off signals are output via both of the first signal end S1 and the enable signal end EM. An equivalent circuit diagram of the OLED pixel circuit shown in FIG. 5 is shown as FIG. 8, the first transistor T1 is turned on, while the second transistor T2, the third transistor T3, the fourth transistor T4, the fifth transistor T5, the sixth transistor T6 and the seventh transistor T7 are all turned off.

Figure 8:
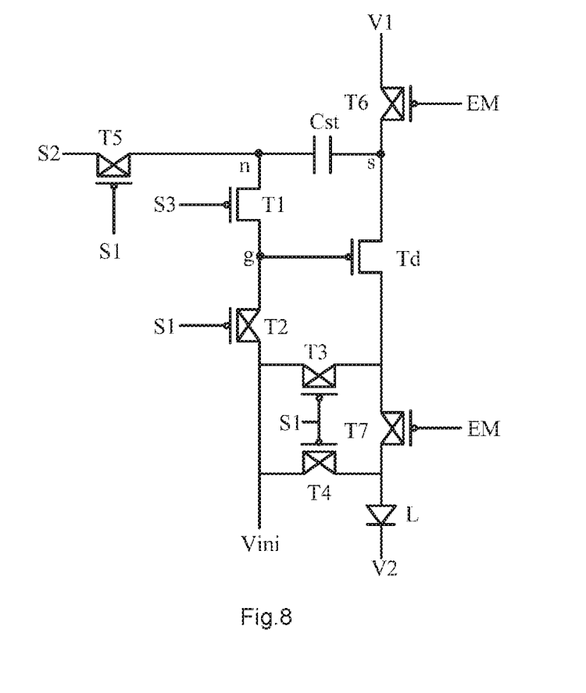

The first transistor T1 is turned on, so that the reservoir capacitor Cst transmits a data signal stored therein to the gate electrode of the driving transistor Td via the first transistor T1, to drive the driving transistor Td to be turned on. Here, the voltage at the point "g" is Vdata, the voltages at other points do not change.

It will be noted that, in order to ensure that the driving transistor Td can be turned on, the condition Vdata<Vr should be satisfied, so that Vgs of the driving transistor Td is less than its Vth, that is, Vgs<Vth.

After the first sub-phase P2' of the second phase P2 is over, the voltage at the point "g" is Vdata, the voltage at the point "s" is Vr−Vth, and the voltage at the point "n" is Vdata.

In the second phase P2 of the frame, for example in a second sub-phase P2″, low level turn-on signals are output via both of the third signal end S3 and the enable signal end EM, and a high level turn-off signal is output via the first signal end S1. Based on this, an equivalent circuit diagram of the OLED pixel circuit shown in FIG. 5 is shown as FIG. 9, the first transistor T1, the sixth transistor T6 and the seventh transistor T7 are all turned on, while the second transistor T2, the third transistor T3, the fourth transistor T4 and the fifth transistor T5 are all turned off.

Figure 9:
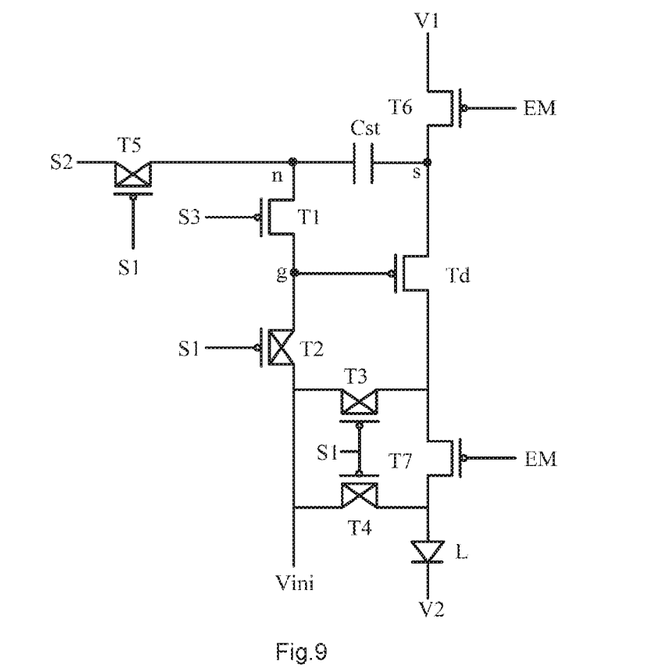

The sixth transistor T6 is turned on, so that the supply voltage output via the first voltage end V1 is input to the first electrode of the driving transistor Td via the sixth transistor T6, i.e., the voltage at the point "s" is VDD. The voltage at the point "s" is jumped to VDD from Vr−Vth, and a jumping value is ΔV=VDD−(Vr−Vth). Based on this, according to a bootstrap effect of the capacitor, the voltage of the first end (the point "n") of the reservoir capacitor Cst is changed to Vdata+ΔV=Vdata+VDD−(Vr−Vth), meanwhile, the voltage at the point "g" is also Vdata+VDD−(Vr−Vth).

The seventh transistor T7 is turned on, so that a driving signal output by the driving transistor Td is transmitted to the anode of the light-emitting device L via the seventh transistor T7. Meanwhile, the supply voltage output via the second voltage end V2 is input to the cathode of the light-emitting device L, the light-emitting device L emits light under control of a driving signal output by the driving transistor Td and the supply voltage VSS output by the second voltage end V2.

In other words, in the second sub-phase P2″ (i.e., in the light emitting process) of the second phase P2, the voltage at the point "g" is Vdata+VDD−(Vr−Vth), the voltage at the point "s" is VDD, and the voltage of the point "n" is Vdata+VDD−(Vr−Vth).

According to a saturation current formula of the driving transistor Td, it can be obtained:

$$Ids = \frac{1}{2}k(Vgs - Vth)^2$$
$$= \frac{1}{2}k[Vdata + VDD - (Vr - Vth) - VDD - Vth]^2$$
$$= \frac{1}{2}k(Vdata - Vr)^2 \circ$$

Where, K=W/L×C×u, W/L is a width to length ratio, C is a capacitance of a channel insulating layer, and u is a channel carrier mobility.

It can be seen that, the driving current of the driving transistor Td has been unaffected by the VDD and the Vth, and only relates to the Vdata and the Vr. An influence of the threshold voltage Vth of the driving transistor Td on a luminance brightness of the light-emitting device L is eliminated, and an influence caused by a voltage drop of VDD is eliminated.

Figure 10:
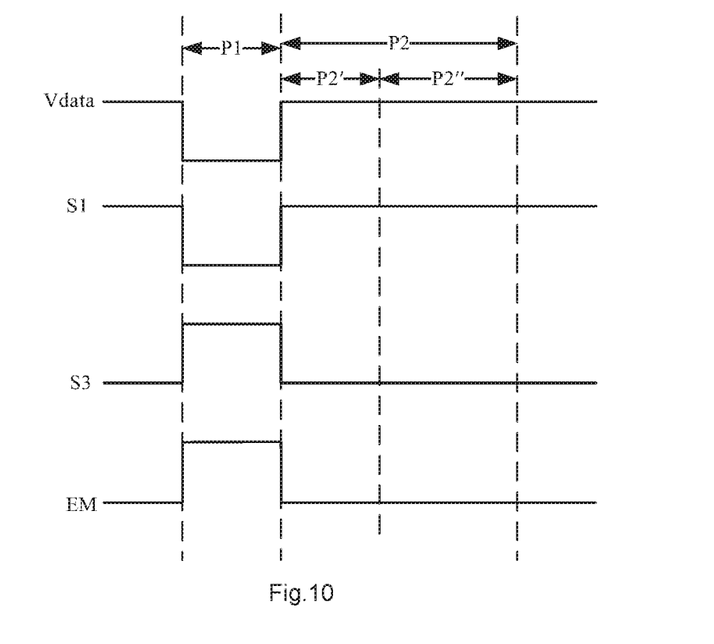
FIG. 10 is another signal timing diagram used to drive the OLED pixel circuit shown in FIGS. 4 and 5.

In some embodiments, in order to simplify the structure of the pixel circuit, and reduce the cost of driving the IC, as shown in FIG. 10, low level turn-on signals are output via both of the third signal end S3 and the enable signal end EM and a high level turn-off signal is output via the first signal end S1 in the first sub-phase P2' of the second phase P2 of the frame, which is the same as FIG. 6. Based on this, in the second phase P2 (including the first sub-phase P2' and the second sub-phase P2″) of the frame, the equivalent circuit diagram of the OLED pixel circuit shown in FIG. 5 is shown as FIG. 9, the first transistor T1, the sixth transistor T6 and the seventh transistor T7 are all turned on, while the second transistor T2, the third transistor T3, the fourth transistor T4 and the fifth transistor T5 are all turned off.

The first transistor T1 is turned on, so that the reservoir capacitor Cst transmits the data signal stored therein to the gate electrode of the driving transistor Td, to drive the driving transistor Td to be turned on.

Meanwhile, the sixth transistor T6 is turned on, so that the supply voltage output via the first voltage end V1 is input to the first electrode of the driving transistor Td via the sixth transistor T6, here, the voltage at the point "s" is VDD. Since the voltage at the point "s" is jumped to VDD from Vr−Vth, and the jumping value is ΔV=VDD−(Vr−Vth), the voltage of the first end (the point "n") of the reservoir capacitor Cst is changed to Vdata+ΔV=Vdata+VDD−(Vr−Vth) according to the bootstrap effect of the capacitor. Since the first transistor T1 is in a turn-on state, the voltage at the point "g" is also Vdata+VDD−(Vr−Vth).

The seventh transistor T7 is turned on, so that the driving signal output by the driving transistor Td is transmitted to the anode of the light-emitting device L via the seventh transistor T7. Meanwhile, the supply voltage output by the second voltage end V2 is input to the cathode of the light-emitting device L, the light-emitting device L emits light under control of the driving signal output by the driving transistor Td and the supply voltage VSS output by the second voltage end V2.

In other words, in the second phase P2, the voltage at the point "g" is Vdata+VDD−(Vr−Vth), the voltage of the point "s" is VDD, and the voltage at the point "n" is Vdata+VDD−(Vr−Vth).

In a case where the value obtained from an operation that a gate-source voltage Vgs of the driving transistor Td minus the threshold voltage Vth of the driving transistor Td is larger than a drain-source voltage Vds of the driving transistor Td, i.e., Vgs−Vth>Vds, the driving transistor Td is in a saturation turn-on state. The driving current Ids flowing through the driving transistor Td is:

$$Ids = \frac{1}{2}k(Vgs - Vth)^2$$
$$= \frac{1}{2}k[Vdata + VDD - (Vr - Vth) - VDD - Vth]^2$$
$$= \frac{1}{2}k(Vdata - Vr)^2 \circ$$

It can be seen that, the current flowing through the driving transistor Td is only related to the data voltage output via the second signal end S2 for realizing a display and the reset voltage output via the initial voltage end Vini, and independent from the threshold voltage Vth of the driving transistor Td. So that the influence of the threshold voltage Vth of the driving transistor Td on the luminance brightness of the light-emitting device L is eliminated, thereby improving the uniformity of the luminance brightness of the light-emitting device L. In addition, the current flowing through the driving transistor Td is also independent from the supply voltage VDD output via the first voltage end V1, thereby eliminating the influence caused by the voltage drop of the VDD, and further improving the uniformity of the luminance brightness of the light-emitting device L.

A fact obtained by performing a simulation experiment for the OLED pixel circuit provided by the embodiments of the present disclosure is as follows. In a case where the ΔVth of the driving transistor Td is equal to 1V, the current uniformity of the pixel circuit reaches 87.6%, wherein the ΔVth is a variation of the Vth. That is, when a variation of the Vth ranges within 1V (for example the Vth ranges from −2V to −3V), the current uniformity of the pixel circuit reaches 87.6%. It can be seen that, the OLED pixel circuit has a better compensation effect for a drift of the threshold voltage.

In a case where ΔVDD=0.5V, the current uniformity is about 94%. The ΔVDD is a variation of the VDD. That is, in a case where the variation of the VDD ranges within 0.5V (for example the VDD ranges from 4.1V to 4.6V), the current uniformity reaches to 94%. It can be seen that, the OLED pixel circuit has a better compensation effect for the voltage drop of the VDD, which is beneficial to the design and arrangement of the VDD line in the display panel.

Some embodiments of the present disclosure provide a display apparatus. The display apparatus includes the OLED pixel circuit.

The display apparatus includes a plurality of pixel units which are arranged in an array, each of the plurality of pixel units includes any one of the OLED pixel circuits as described above. The display apparatus provided by the embodiments of the present disclosure has the same beneficial effects with the OLED pixel circuit. Since the OLED pixel circuit has been described in detail in the aforementioned embodiments, it will not be repeated herein.

Figure 11:
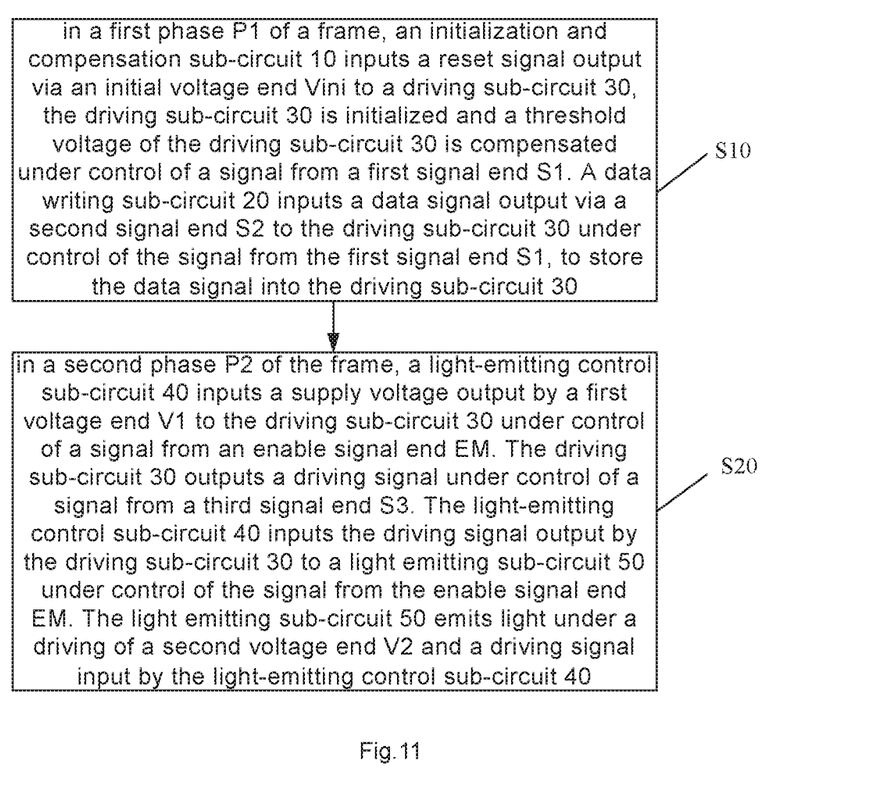
FIG. 11 is a flow chart of a method for driving an OLED pixel circuit provided by embodiments of the present disclosure.

Some embodiments of the present disclosure further provide a method for driving an OLED pixel circuit. As shown in FIG. 11, the method includes:

S10, in a first phase P1 of a frame, an initialization and compensation sub-circuit 10 inputs a reset signal output via an initial voltage end Vini to a driving sub-circuit 30, the driving sub-circuit 30 is initialized and a threshold voltage of the driving sub-circuit 30 is compensated under control of a signal from a first signal end S1. A data writing sub-circuit 20 inputs a data signal output via a second signal end S2 to the driving sub-circuit 30 under control of the signal from the first signal end S1, to store the data signal into the driving sub-circuit 30.

In some embodiments, as shown in FIG. 4, the driving sub-circuit 30 includes a first transistor T1, a driving transistor Td and a reservoir capacitor Cst. The initialization and compensation sub-circuit 10 includes a second transistor T2, a third transistor T3. The data writing sub-circuit 20 includes a fifth transistor T5.

The first signal end S1 inputs a turn-on signal, to control the second transistor T2, the third transistor T3 and the fifth transistor T5 to be turned on. A reset signal output by the initial voltage end Vini is input to the driving transistor Td via the second transistor T2, the driving transistor Td is initialized and the threshold voltage of the driving transistor Td is compensated. A data signal output by the second signal end S2 is input to the reservoir capacitor Cst via the fifth transistor T5, to store the data signal into the reservoir capacitor Cst.

In some embodiments, as shown in FIG. 5, the initialization and compensation sub-circuit 10 further includes a fourth transistor T4. The method further includes the following contents.

The first signal end S1 inputs a turn-on signal, to control the fourth transistor T4 to be turned on. The reset signal output by the initial voltage end Vini is input to the light emitting sub-circuit 50 via the fourth transistor T4 to initialize the light emitting sub-circuit 50.

S20, in a second phase P2 of the frame, a light-emitting control sub-circuit 40 inputs a supply voltage output by a first voltage end V1 to the driving sub-circuit 30 under control of a signal from an enable signal end EM. The driving sub-circuit 30 outputs a driving signal under control of a signal from a third signal end S3. The light-emitting control sub-circuit 40 inputs the driving signal output by the driving sub-circuit 30 to a light emitting sub-circuit 50 under control of the signal from the enable signal end EM. The light emitting sub-circuit 50 emits light under a driving of a second voltage end V2 and a driving signal output by the light-emitting control sub-circuit 40.

The light-emitting control sub-circuit 40 includes a sixth transistor T6 and a seventh transistor T7.

In some embodiments, as shown in FIG. 6, in a first sub-phase P2' of the second phase P2 of the frame, the third signal end S3 inputs a turn-on signal, and the reservoir capacitor Cst transmits the data signal stored therein to a gate electrode of the driving transistor Td via the first transistor T1. In a second sub-phase P2" of the second phase P2 of the frame, while the third signal end S3 inputs a turn-on signal continuously, the enable signal end EM inputs a turn-on signal.

In other words, in the first sub-phase P2' of the second phase P2 of the frame, the third signal end S3 inputs a turn-on signal, to control the first transistor T1 to be turned on, and the reservoir capacitor Cst transmits the data signal stored therein to the gate electrode of the driving transistor Td via the first transistor T1, to control the driving transistor Td to be turned on.

In the second sub-phase P2" of the second phase P2 of the frame, the third signal end S3 inputs a turn-on signal to control the first transistor T1 to be turned on. The enable signal end EM inputs a turn-on signal to control the sixth transistor T6 and the seventh transistor T7 to be turned on. The supply voltage output by the first voltage end V1 is input to the driving transistor Td via the sixth transistor T6. The driving transistor Td outputs the driving signal under control of the data signal and the supply voltage, and the driving signal is transmitted to the light emitting sub-circuit 50 via the seventh transistor T7.

The light emitting sub-circuit 50 emits light under control of the driving signal and the supply voltage output via the second voltage end V2.

In some other embodiments, as shown in FIG. 10, in the second phase P2 of the frame, turn-on signals are output via both of the third signal end S3 and the enable signal end EM simultaneously.

In other words, in the second phase P2 of the frame, a turn-on signal is output via the third signal end S3 to control the first transistor T1 to be turned on. The reservoir capacitor Cst transmits the data signal stored therein to the gate electrode of the driving transistor Td via the first transistor T1, to control the driving transistor Td to be turned on.

Meanwhile, the enable signal end EM inputs a turn-on signal, to control the sixth transistor T6 and the seventh transistor T7 to be turned on. The supply voltage output via the first voltage end V1 is input to the driving transistor Td via the sixth transistor T6. The driving transistor Td outputs the driving signal under control of the data signal and the supply voltage. The driving signal is transmitted to the light emitting sub-circuit 50 via the seventh transistor T7.

The light emitting sub-circuit 50 emits light under control of the driving signal output by the driving transistor Td and the supply voltage output via the second voltage end V2.

The method for driving the OLED pixel circuit provided by the embodiments of the present disclosure compensates the threshold voltage generated by the driving sub-circuit 30 through providing the initialization and compensation sub-circuit 10 in the OLED pixel circuit. In this case, if the same data signal is written into the OLED pixel circuits in different regions of the display panel, the different OLED pixel circuits may not have a difference in the threshold voltage, and thus the current supplied to the OLED devices in different regions may not be different. Therefore the problem that the display panel brightness is unevenly displayed may be avoided.

The above description is merely some exemplary embodiments of the present disclosure, but the scope of the present disclosure is not limited thereto, and changes or substitutions within the technical scope of the disclosure that can be easily though by those person skilled in the art should be considered to be within protection scope of the present disclosure. Therefore, the protection scope of the present disclosure should be subject to the protection scope of the claims.

What is claimed is:

1. An OLED pixel circuit, comprising:
   an initialization and compensation sub-circuit, connected to a driving sub-circuit, a first signal input, an initial voltage input and light emitting sub-circuit, wherein the initialization and compensation sub-circuit is configured to initialize the driving sub-circuit and the light emitting sub-circuit and compensate a threshold voltage of the driving sub-circuit according to a signal input by the initial voltage input under control of a signal from the first signal input;
   a data writing sub-circuit, connected to the driving sub-circuit, the first signal input and a second signal input, wherein the data writing sub-circuit is configured to input a signal of the second signal input to the driving sub-circuit under control of a signal from the first signal input; and
   a light-emitting control sub-circuit, connected to the driving sub-circuit, a light emitting sub-circuit, an enable signal input and a first voltage input, wherein the light-emitting control sub-circuit is configured to input a signal of the first voltage input to the driving sub-circuit, and to input a driving signal output by the driving sub-circuit to the light emitting sub-circuit under control of a signal from the enable signal input, wherein
   the driving sub-circuit is further connected to a third signal input, and is configured to output the driving signal under control of a signal from the third signal input and in a case of the signal of the first voltage input being input to the driving sub-circuit; and
   the light emitting sub-circuit is further connected to a second voltage input, and is configured to emit light under a driving of the second voltage input and the driving signal input by the light-emitting control sub-circuit;
   the initialization and compensation sub-circuit includes a second transistor, a third transistor and a fourth transistor;
   a gate electrode of the second transistor is connected to the first signal input, a first electrode of the second transistor is connected to the initial voltage input, and a second electrode of the second transistor is connected to the driving sub-circuit;
   a gate electrode of the third transistor is connected to the first signal input, a first electrode of the third transistor is connected to the first electrode of the second transistor, and a second electrode of the third transistor is connected to the driving sub-circuit; and
   a gate electrode of the fourth transistor is connected to the first signal input, a first electrode of the fourth transistor is connected to the initial voltage input, and a second electrode of the fourth transistor is directly connected to the light emitting sub-circuit.

2. The OLED pixel circuit according to claim 1, wherein, the enable signal input and the third signal input are connected with a same signal input.

3. The OLED pixel circuit according to claim 1, wherein, the driving sub-circuit comprises a first transistor, a driving transistor and a reservoir capacitor, wherein
- a first end of the reservoir capacitor is connected to the data writing sub-circuit, and a second end of the reservoir capacitor is connected to a first electrode of the driving transistor;
- a gate electrode of the first transistor is connected to the third signal input, a first electrode of the first transistor is connected to the first end of the reservoir capacitor, and a second electrode of the first transistor is connected to a gate electrode of the driving transistor; and
- the gate electrode of the driving transistor is further connected to the initialization and compensation sub-circuit, the first electrode of the driving transistor is further connected to the light-emitting control sub-circuit, and a second electrode of the driving transistor is connected to the initialization and compensation sub-circuit and the light-emitting control sub-circuit.

4. The OLED pixel circuit according to claim 1, wherein, the data writing sub-circuit comprises a fifth transistor, wherein
- a gate electrode of the fifth transistor is connected to the first signal input, a first electrode of the fifth transistor is connected to the second signal input, and a second electrode of the fifth transistor is connected to the driving sub-circuit.

5. The OLED pixel circuit according to claim 1, wherein, the light-emitting control sub-circuit comprises a sixth transistor and a seventh transistor, wherein
- a gate electrode of the sixth transistor is connected to the enable signal input, a first electrode of the sixth transistor is connected to the first voltage input, and a second electrode of the sixth transistor is connected to the driving sub-circuit; and
- a gate electrode of the seventh transistor is connected to the enable signal input, a first electrode of the seventh transistor is connected to the driving sub-circuit, and a second electrode of the seventh transistor is connected to the light emitting sub-circuit.

6. The OLED pixel circuit according to claim 1, wherein, the driving sub-circuit comprises a first transistor, a driving transistor and a reservoir capacitor; the initialization and compensation sub-circuit comprises a second transistor, a third transistor and a fourth transistor; the data writing sub-circuit comprises a fifth transistor; the light-emitting control sub-circuit comprises a sixth transistor and a seventh transistor; and the light emitting sub-circuit comprises a light-emitting device, wherein
- a gate electrode of the fifth transistor is connected to the first signal input, a first electrode of the fifth transistor is connected to the second signal input, and a second electrode of the fifth transistor is connected to a first end of the reservoir capacitor;
- a second end of the reservoir capacitor is connected to a first electrode of the driving transistor; a gate electrode of the first transistor is connected to the third signal input, a first electrode of the first transistor is connected to the first end of the reservoir capacitor, and a second electrode of the first transistor is connected to a gate electrode of the driving transistor and a second electrode of the second transistor; the gate electrode of the driving transistor is further connected the second electrode of the second transistor, the first electrode of the driving transistor is further connected to a second electrode of the sixth transistor, and a second electrode of the driving transistor is connected to a second electrode of the third transistor and a first electrode of the seventh transistor;
- a gate electrode of the sixth transistor is connected to the enable signal input, and a first electrode of the sixth transistor is connected to the first voltage input; a gate electrode of the seventh transistor is connected to the enable signal input, and a second electrode of the seventh transistor is connected to an anode of the light-emitting device;
- a gate electrode of the second transistor is connected to the first signal input, and a first electrode of the second transistor is connected to the initial voltage input; a gate electrode of the third transistor is connected to the first signal input, and a first electrode of the third transistor is connected to the initial voltage input; a gate electrode of the fourth transistor is connected to the first signal input, a first electrode of the fourth transistor is connected to the initial voltage input, and a second electrode of the fourth transistor is connected to the anode of the light-emitting device; and
- a cathode of the light-emitting device is connected to the second voltage input.

7. A display apparatus, comprising the OLED pixel circuit of claim 1, wherein, the OLED pixel circuit comprises:
- an initialization and compensation sub-circuit, connected to a driving sub-circuit, a first signal input and an initial voltage input, and configured to initialize the driving sub-circuit and compensate a threshold voltage of the driving sub-circuit according to a signal input by the initial voltage input under control of a signal from the first signal input;
- a data writing sub-circuit, connected to the driving sub-circuit, the first signal input and a second signal input, and configured to input a signal of the second signal input to the driving sub-circuit under control of a signal from the first signal input;
- a light-emitting control sub-circuit, connected to the driving sub-circuit, a light emitting sub-circuit, an enable signal input and a first voltage input, and configured to input a signal of the first voltage input to the driving sub-circuit, and to input a driving signal output by the driving sub-circuit to the light emitting sub-circuit under control of a signal from the enable signal input;
- the driving sub-circuit, further connected to a third signal input, and configured to output the driving signal under control of a signal from the third signal input and in a case of the signal of the first voltage input being input to the driving sub-circuit; and
- a light emitting sub-circuit, further connected to a second voltage input, and configured to emit light under a driving of the second voltage input and the driving signal input by the light-emitting control sub-circuit.

8. A method for driving an OLED pixel circuit according to claim 1, wherein, the driving sub-circuit comprises a first transistor, a driving transistor and a reservoir capacitor; the initialization and compensation sub-circuit comprises a second transistor, a third transistor and a fourth transistor; and the data writing sub-circuit comprises a fifth transistor; wherein, the method, comprising:
- in a first phase of a frame, inputting, via the first signal input, a turn-on signal to control the second transistor, the third transistor and the fifth transistor to be turned on, and inputting a reset signal output from the initial voltage input to the driving transistor via the second transistor, so that initializing the driving transistor and compensating a threshold voltage of the driving sub-circuit; and inputting the reset signal output from the initial voltage input further to the light emitting sub-circuit via the fourth transistor to initialize the light emitting sub-circuit; inputting, by the fifth transistor, a data signal output via the second signal input to the reservoir capacitor via the fifth transistor under control of the signal from the first signal input, to store the data signal into the reservoir capacitor;

in a second phase of the frame, inputting, by a light-emitting control sub-circuit, a supply voltage output via a first voltage input to the driving sub-circuit under control of a signal from an enable signal input; outputting, by the driving sub-circuit, a driving signal under control of a signal from a third signal input; inputting, by the light-emitting control sub-circuit, the driving signal output by the driving sub-circuit to a light emitting sub-circuit under control of a signal from the enable signal input; and emitting light, by the light emitting sub-circuit under a driving of the driving signal input by the light-emitting control sub-circuit and a second voltage input.

9. The method according to claim 8, wherein, the light-emitting control sub-circuit comprises a sixth transistor and a seventh transistor, the method further comprises:

in the second phase of the frame, inputting, via the third signal input, a turn-on signal to control the first transistor to be turned on; and transmitting, by the reservoir capacitor, the data signal stored therein to a gate electrode of the driving transistor via the first transistor, to control the driving transistor to be turned on;

inputting, via the enable signal input, a turn-on signal to control the sixth transistor and the seventh transistor to be turned on; inputting a supply voltage output via the first voltage input to the driving transistor via the sixth transistor; outputting, by the driving transistor, the driving signal under control of the data signal and the supply voltage, and transmitting the driving signal to the light emitting sub-circuit via the seventh transistor; and the light emitting sub-circuit emitting light under control of the driving signal and the supply voltage output by the second voltage input.

10. The method according to claim 9, wherein, in the second phase of the frame, the turn-on signals of the third signal input and the enable signal input are input simultaneous; or, in a first sub-phase of the second phase of the frame, inputting a turn-on signal via the third signal input; and the reservoir capacitor transmits the data signal stored therein to the gate electrode of the driving transistor via the first transistor; and in a second sub-phase of the second phase of the frame, inputting a turn-on signal via the third signal input continuously, and inputting a turn-on signal via the enable signal input.

* * * * *